United States Patent [19]
Pfeiffer

[11] 4,213,053
[45] Jul. 15, 1980

[54] ELECTRON BEAM SYSTEM WITH CHARACTER PROJECTION CAPABILITY

[75] Inventor: Hans C. Pfeiffer, Ridgefield, Conn.

[73] Assignee: International Business Machines Corporation, Armonk, N.Y.

[21] Appl. No.: 960,511

[22] Filed: Nov. 13, 1978

Related U.S. Application Data

[63] Continuation of Ser. No. 823,352, Aug. 10, 1977, abandoned.

[51] Int. Cl.² .............................................. H01J 37/00
[52] U.S. Cl. .................................. 250/492 A; 250/398
[58] Field of Search ............... 250/492 A, 492 R, 398, 250/505, 311, 396 R; 219/121 EB, 121 EM

[56] References Cited

U.S. PATENT DOCUMENTS

| | | | |
|---|---|---|---|
| 3,118,050 | 1/1964 | Hetherington | 250/492 A |
| 3,150,258 | 9/1964 | Wilska | 250/396 |
| 3,876,883 | 4/1975 | Broers et al. | 250/492 A |
| 3,894,271 | 7/1975 | Pfeiffer | 250/492 A |

Primary Examiner—Bruce C. Anderson
Attorney, Agent, or Firm—James M. Thomson; James R. McBride

[57] ABSTRACT

An electron beam system useful in microfabrication of large scale integrated circuit patterns, particularly those of repetitive nature. The electron beam system includes beam shaping and aperture means disposed between an electron beam source and a target area which permit formation and projection of preselected entire characters or portions thereof into the target area for writing upon a wafer at that location. The pattern cells of such characters may contain as many as 1600 image points which are addressed and projected in parallel, thereby greatly reducing the handling requirements for pattern data as opposed to the techniques utilized in prior art scanning electron beam systems. The system further includes means for correcting for spherical aberration arising in the projection of images comprising a large number of parallel image points.

5 Claims, 8 Drawing Figures

ELECTRON BEAM SYSTEM WITH CHARACTER PROJECTION CAPABILITY

This is a continuation of application Ser. No. 823,352 filed Aug. 10, 1977 now abandoned.

BACKGROUND OF THE INVENTION

The present invention relates to an electron beam system designed for use in microfabrication of large scale integrated circuit patterns. More particularly, the invention concerns an electron beam system which is capable of the formation and projection of entire characters or portions thereof, such as those characters to be written in large scale integrated circuit patterns of repetitive nature, i.e., magnetic bubble memory patterns.

Electron beam columns have been adapted widely for use in systems for the microfabrication of large scale integrated semiconductor circuits. Such columns have particular utility in the writing of selected patterns on semiconductor wafers, i.e., in projecting the patterns upon selected areas of photoresist which are then developed to form the photoresist masks extensively used in a wide variety of operations during IC fabrication. The function of any such system is to write a given pattern over a given area with a specified charge density and with adequate edge resolution in the shortest time possible. In cases where compatibility with other lithography systems is required, absolute deflection accuracy and repeatability are essential. For very small patterns it becomes necessary to alter the charge density at different points along the pattern to compensate for proximity effects. In addition, for multi-level patterns it is essential to be able to overlay the successive layers of the pattern with satisfactory accuracy.

In view of the above requirements various electron beam lithography systems have been designed and utilized. The typical electron beam system utilized in connection with such integrated circuit microfabrication may include an electron beam source, condenser lenses, alignment stages, demagnification lens stages, a projection lens, a deflection unit and a target area arranged in well known fashion. For example, U.S. Pat. No. 3,644,700 issued Feb. 22, 1972 to Kruppa et al., describes a typical electron beam column. Other electron beam columns and components thereof are described in U.S. Pat. No. 3,949,228 to Ryan and U.S. Pat. No. 3,984,678 to Loeffler et al.

One widely used approach in the design of electron beam columns used in microfabrication is a round beam imaging approach. In this approach, an electron beam is demagnified to form a small focused image of the electron gun crossover point. The spot profile is approximately Gaussian in nature. The demagnification is adjusted so that the spot diameter is smaller than the smallest pattern line width required to be written. Each pattern element is then written by moving the beam sequentially from point to point over the pattern element until the entire written area is filled in.

If necessary, the dwell time at each point on the pattern element can be adjusted to provide proximity effect corrections. A round beam imaging system can be utilized either in a vector scanning mode or in a line by line or orthogonal scanning mode. Such systems have an advantage in that they can be utilized to write both orthogonal and diagonal patterns. However, the Gaussian spot is a small pattern diameter and, therefore, the time requirements in writing of typical semiconductor patterns are prohibitive to the efficient use of such systems for manufacturing. Moreover, the pattern data involved in recreating a given set of semiconductor images with a Gaussian spot is extremely massive. Accordingly, the data processing capabilities of such systems are expensive.

Other electron beam columns have been adapted for microfabrication of semiconductors utilizing a fixed shape beam image. For example, the Kruppa patent mentioned hereinbefore describes one such system. Thus, a square beam system exposes a number of image points in parallel and gains an equivalent factor in thruput over Gaussian spot type systems. In such schemes the electron beam is focused to provide a demagnified image of an aperture called the beam shaping aperture. The beam shaping aperture is square and such systems are particularly useful in fabricating or following patterns by sequentially filling in squares of the pattern area. The size of the focused square spot is generally chosen to be the same as the minimum pattern line that is required and the optical system is designed so that the edge resolution of the spot is considerably less than this. Each pattern element is written by moving the shaped beam in discrete jumps so that the pattern is written as a series of squares.

The square beam imaging systems have certain advantages over the traditional Gaussian round beam systems, as are set forth in detail in the publication "New Imaging and Deflection Concepts for Proforming Microfabrication Systems", by H. C. Pfeiffer, Journal of Vacuum Science and Technology, December 1975, Vol. 12, No. 6, pages 1170-1173. However, the square beam imaging systems have certain disadvantages in that they require a handling capability for a great deal of pattern information or data; and in addition, the use of such square shaped beam systems in an efficient manner is limited to recreation of beam patterns having a large percentage of orthogonally oriented pattern outlines. Thus, patterns involving a large number of diagonal outlines are difficult to reproduce.

Other imaging concepts have been utilized in electron beam columns; for example, in copending application Ser. No. 771,235, for Method and Apparatus for Forming a Variable Size Electron Beam, H. C. Pfeiffer, P. M. Ryan and E. V. Weber, filed Feb. 23, 1977, and assigned to the assignee of the present application. The referenced application describes a system utilizing an extension of the fixed shape beam imaging concept. However, in the method described two beam shaping apertures are used, placed at conjugate planes, and a deflection system is placed between the two apertures. With the deflection system switched off the second square aperture is fully illuminated, thereby resulting in a square focus spot of maximum dimensions. When the deflection system is energized, the illumination of any portion of the second square aperture can be blanked off producing a rectangular or square spot of any desired size, up to the maximum, containing the same current density as the original square spot.

Since the size of the spot can be arbitrarily reduced the maximum dimensions of the spot can be larger than the minimum line width of the pattern. A pattern can then be filled in utilizing various combinations of square and rectangular beam images whereby an improved thruput system is attained. In addition, the variable shape beam system provides a capability of writing lines whose widths are not in normal multiples of the basic spot widths without the need for double exposure. Also, it permits use of a framing technique in which the central region of the pattern element is covered with large squares and the perimeter is written with thin lines to reduce electron interaction effect and thereby maintain good edge resolution.

Despite the advantages of the variable shape spot system it is more efficiently used with circuit patterns having a large percentage of orthogonal orientations since it is not easily adapted for writing or handling diagonal data patterns. Moreover, it is not susceptible of easy use with circuit patterns, such as those required in fabrication of magnetic bubble memory circuits, which embody a large number of repetitive elements, such as the typical I and T patterns used for bubble memories.

Accordingly, a need exists in the prior art for an improved electron beam column which would enable fast writing of large scale integration circuit patterns of repetitive nature.

SUMMARY OF THE INVENTION

It is a primary object of the present invention to provide a method and apparatus for exposing selected patterns having highly repetitive nature with an electron beam wherein entire characters or large portions thereof are formed and projected in parallel to the target area.

It is another object of the present invention to provide in such apparatus means for correcting such projected image patterns for spherical aberration.

The foregoing objects are attained with apparatus wherein a source of electrons is projected toward a target area or plane. In the usual fashion a semiconductor wafer is located at the target plane and the electron beam is controlled in such a fashion as to write upon resist layers formed on the wafer.

The system also includes beam shaping and aperture means disposed between the source and the target area which permit formation and projection of preselected entire characters or portions thereof onto the target area. Such beam shaping means typically include a first square aperture similar to that utilized in the afore-mentioned Pfeiffer et al. application, and a second character aperture located in the position generally assumed by the second square aperture of the afore-mentioned Pfeiffer application. The character aperture defines a plurality of openings representing entire characters or character portions, each of which may be selectively addressed by the square image formed by the first square aperture of the system.

In typical fashion, the image of the first spot shaping aperture is directed to a particular section of the character aperture and means are provided for focusing the image of the first aperture in the plane of the second aperture to thereby form a composite spot shape defined by the image of the first square aperture and the particular character or fraction of a character selected on the second aperture. Means are provided for defocusing and deflecting the character image thus formed to a particular location on the target wafer and further means are provided to correct the character pattern image for spherical aberration which might otherwise occur in the system.

DETAILED DESCRIPTION OF THE INVENTION

Figure 1:
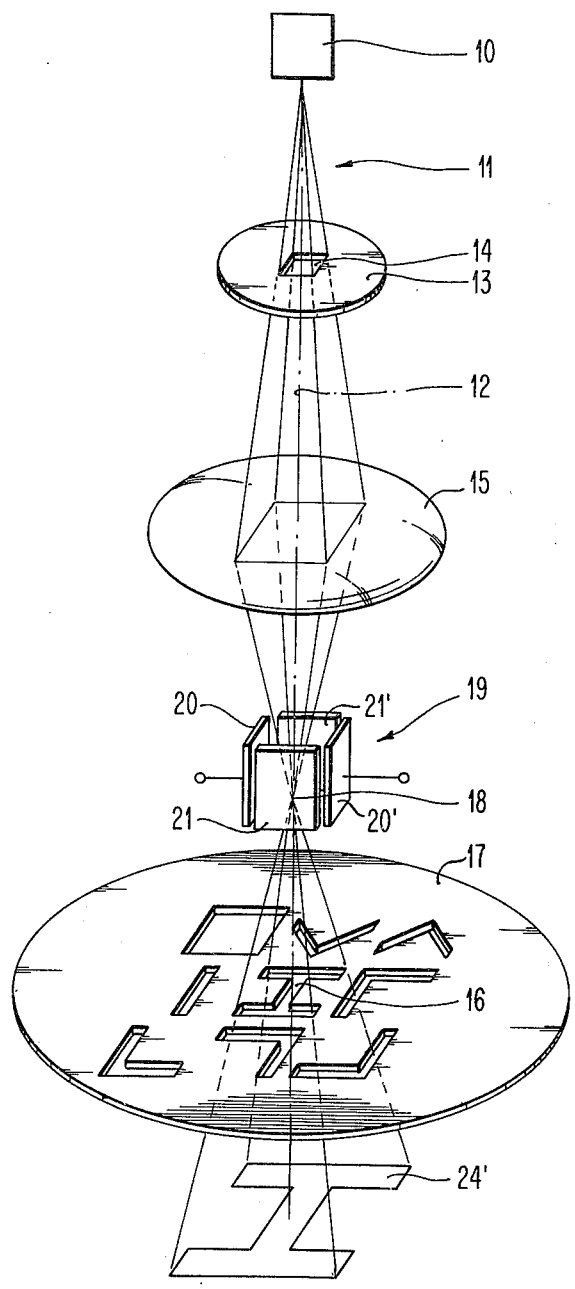
FIG. 1 is a schematic representation of one portion of an electron beam column designed in accordance with the present invention.

Referring now to the drawings and particularly to FIG. 1, apparatus is disclosed for shaping an electron beam spot to form an entire character for projection. More particularly, an electron source 10 is provided directing a beam of electrons 11 along an axis 12 in an electron beam column toward a target, not illustrated. The beam is shaped into a rectangular spot by passing the beam through a square aperture 14 in shaping member 13. A condenser lens 15 is provided which simultaneously focuses the image of aperture 14 in the plane of a character aperture 16 of character member 17 and focuses the image of the source 10 at a position 18 in a plane coincident with the center of deflection provided by character selection means 19 which are adapted to selectively move the focused image of the first aperture laterally with respect to the character apertures.

In the embodiment of FIG. 1 the character selection means are conventional electrostatic deflection plates with plates 20 and 20' acting to deflect the square beam image in the X direction, and plates 21, 21' acting to deflect the square beam image in the Y direction. The final shaped image, illustrated in FIG. 1 as an I character, is determined by the portion of the square aperture image which is not blocked by the selected character shape of character member 17 and passes through the aperture as a shaped composite image 24'. Although the operation has been illustrated with respect to an undeflected image it should be understood that various combinations of deflections of the square aperture image in the X and Y direction can be utilized to select any of the character images and/or portions thereof provided in the character member.

The apparatus illustrated in FIG. 1 may be used in combination with various electron beam columns such as those described in the above mentioned Pfeiffer application or in the Kruppa et al U.S. Pat. No. 3,644,700. When utilized in such columns the character image 24' may be passed through the demagnification lenses and projection lenses to project the image of the selected character onto a target. Standard demagnification, projection and deflection apparatus such as that described in the Kruppa et al patent and/or the Pfeiffer application may be used for this purpose. However, it should be recognized that the present invention contemplates utilization of additional correction means to eliminate spherical aberration involved in the projection of a large number of parallel image points necessary for forming of an entire character image.

Figure 2:
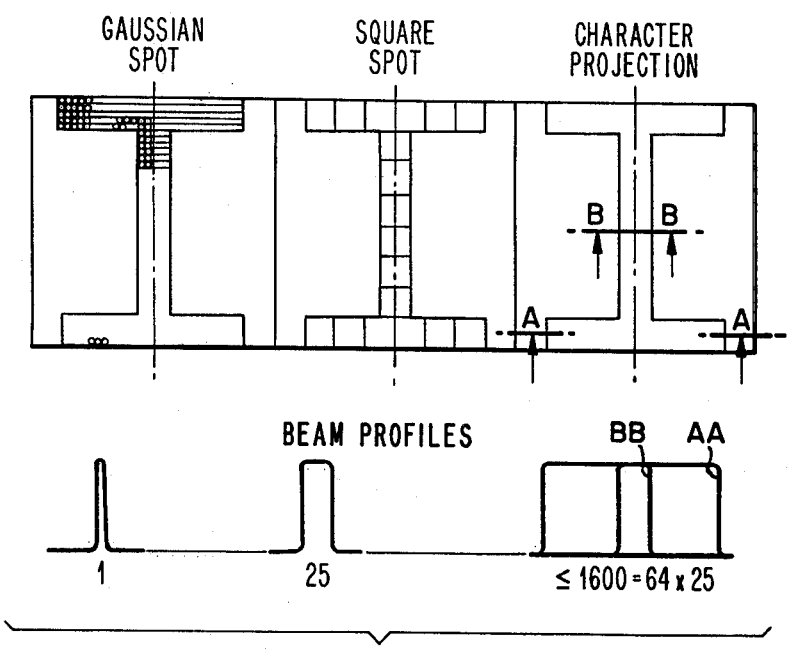
FIG. 2 is a simplified diagrammatic representation of various methods for writing semiconductor patterns utilizing electron beam columns.

For example, referring to FIG. 2, it should be recognized that the formation of an entire character image involves parallel projection of a larger magnitude of image points than was heretofore possible with either the square beam systems or Gaussian spot systems utilized in the prior art. FIG. 2 illustrates the beam profiles or relative number of image points addressed simultaneously by a Gaussian spot system, a square beam image system, and the character projection system described herein, respectively. The specific relationships between the resolution and intensity distribution of the various systems are generally described in the afore-mentioned article and patent application of Pfeiffer.

In particular, a single image point addressed with a Gaussian spot system corresponds to about 25 image points addressed in a typical square beam system. In the character projection system described herein a single spot size is illuminated in the same fashion which the square beam system can reconstruct by focusing successively upon various portions of an 8×8 grid of minimum line elements with the square beam system. Consequently, the projection system simultaneously addresses 64×25 or 1600 image points simultaneously as opposed to the 25 image points addressed with the square beam system. The resulting advantage and thruput should be apparent.

Figure 3:
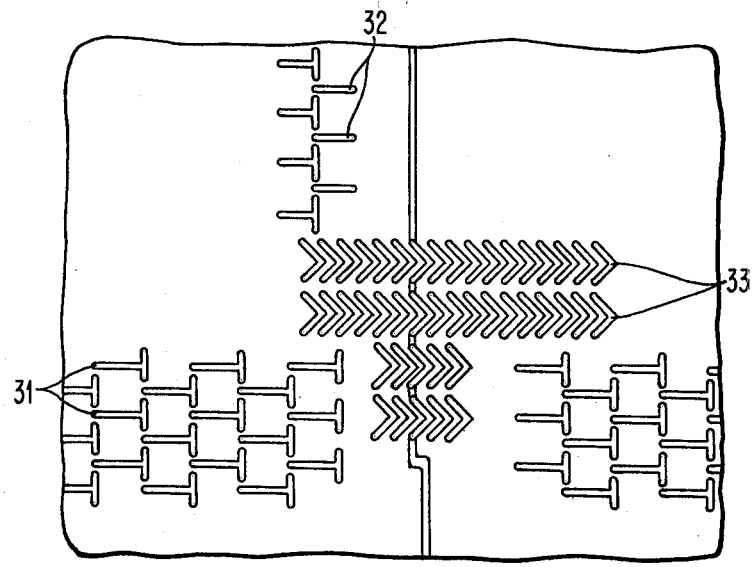
FIG. 3 is a diagrammatic illustration of typical patterns utilized in the fabrication of magnetic bubble memories.

Referring now to FIG. 3 a typical pattern utilized in fabrication of magnetic bubble memories is illustrated. The magnetic bubble pattern forms no part of the invention, however, it should be clear that utilization of the electron beam column described herein in fabrication of such a pattern would be extremely advantageous. For example, the fabrication of the I and T patterns is easily possible utilizing the character segments illustrated in FIG. 1 character aperture. Also, the chevron sections illustrated in the character aperture of FIG. 1 can be utilized to advantage in fabricating the various other character elements illustrated in FIG. 3 and represented by the numerals 31-33. It should be recognized that the character aperture of FIG. 1 could be modified to project other character elements in order to facilitate fabrication of bubble and other semiconductor patterns, if desired.

Figure 4:
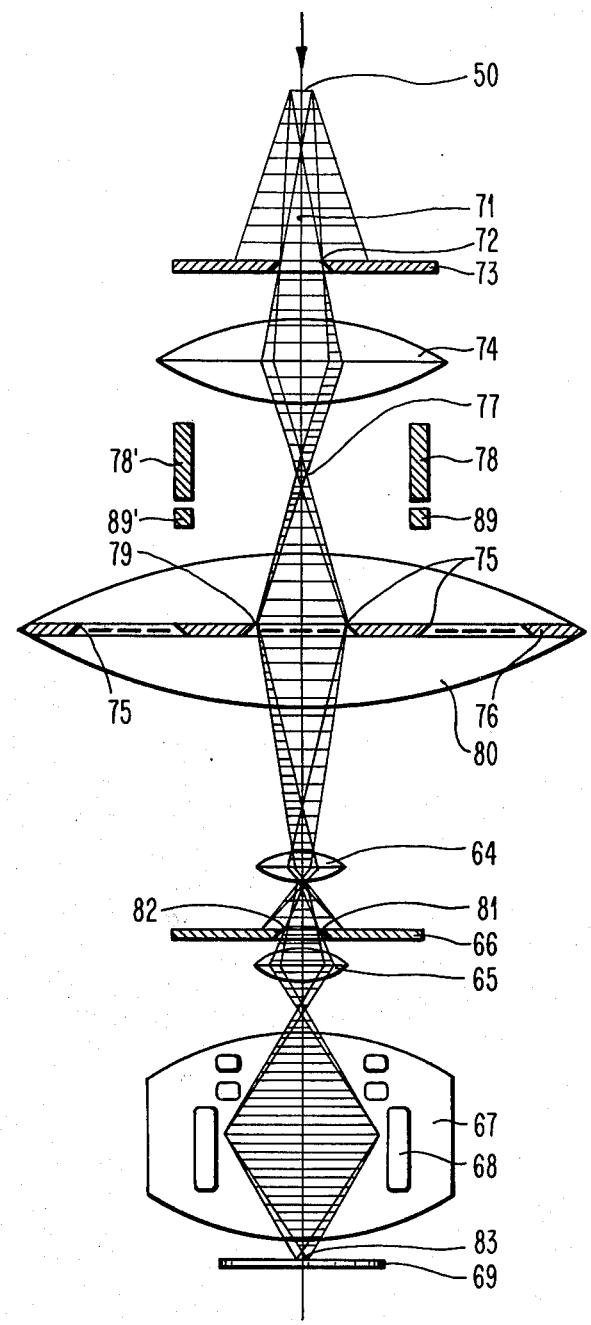
FIG. 4 is a schematic view of an electron beam apparatus designed in accordance with the present invention showing a character pattern projected along the center axis of the column.
Figure 5:
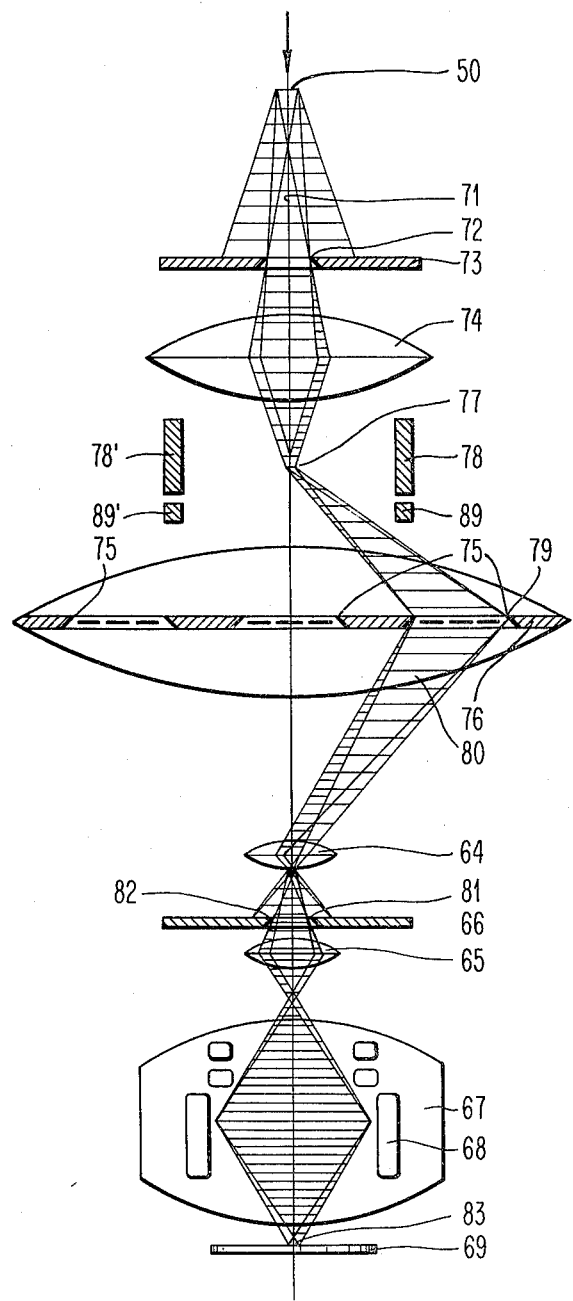
FIG. 5 is a schematic view of the electron beam apparatus of FIG. 4 showing projection of a character pattern selected along the outer periphery of the character apertures.

Referring now to FIGS. 4 and 5 an electron beam column is schematically represented which illustrates how images are formed and deflected according to the invention in writing character images upon a target area. In FIG. 4 an image is projected through the center character of the aperture character and in FIG. 5 an image is projected through a character aperture selected on the outer periphery of the aperture plate. The manner in which correction is applied to obviate spherical aberrations encountered in the FIG. 5 embodiment is illustrated and described in conjunction with FIG. 7 circuitry hereinafter.

FIG. 4 generally comprises an electron beam column including an electron source 50 directing a beam of electrons along the axis of the electron beam column 71. The beam of electrons is intercepted by a square aperture 72 formed in an aperture plate 73, as illustrated. Thus, the beam is shaped into a rectangular spot as it passes through aperture 72. A condenser lens 74 is provided, which may suitably be a magnetic lens of conventional design in the electron beam art. The lens basically performs two functions. First, it focuses the image of aperture 72 in the plane of character aperture plate 76 having character apertures 75 formed therein. In addition, lens 74 focuses the image 77 of source 70 at a point along the column axis and in the center of character selector means comprised of electrostatic plates 78 and 78'.

This pair of deflection plates has the capability of deflecting the focused image 79 of the first square aperture 72 laterally with respect to a preselected character aperture 75 during the beam shaping operation. There is a second pair of plates not illustrated in FIGS. 4 and 5 but located orthogonal with respect thereto which act to deflect the beam laterally in the other orthogonal direction during the shaping operation. The deflection of image 79 of the first aperture with respect to an aperture in plate 76 is more clearly apparent from FIGS. 1 and 5.

Figure 7:
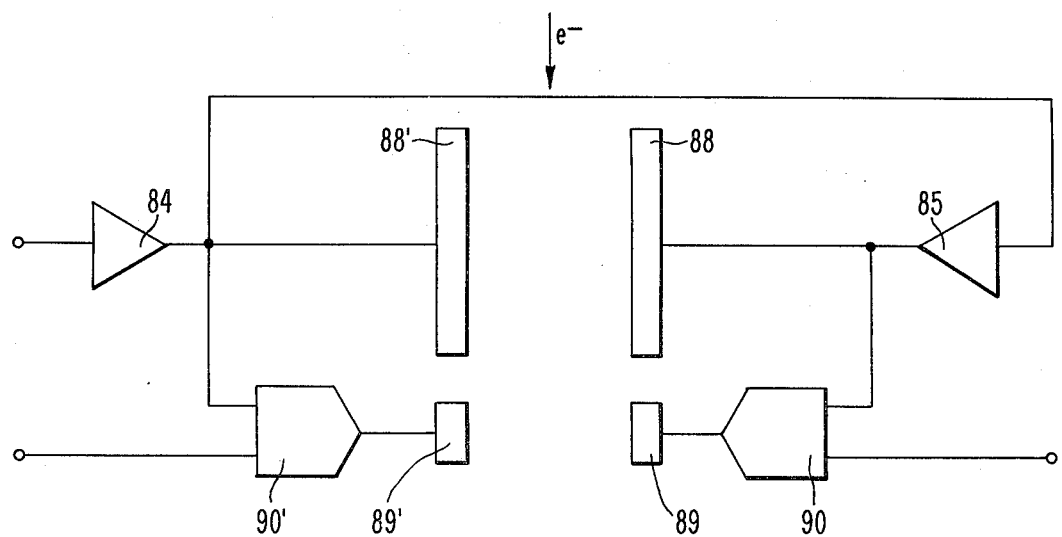
FIG. 7 is a diagrammatic view of deflection apparatus which may be utilized to correct the projected image for spherical aberration.

As is the case in the afore-mentioned Pfeiffer application the optimum operation of the electron beam column of the present invention requires that the focused image 77 of source 70 be at the virtual center of deflection of the deflection means provided by plates 78 and 78', as well as the corresponding pair of plates utilized for deflection in the other orthogonal direction. The focal length of lens 74 is determined primarily to focus the aperture image 79 in the plane of character aperture plate 76. Therefore, the attendant focusing of source image 77 will not necessarily occur at the center of deflection. There is described in detail in the Pfeiffer application means for moving the center of deflection of the electrostatic deflection system into coincidence with the plane of the focused image 77. However, means are provided to effect such correction via correction means 89, 89' as illustrated in FIG. 7 and to apply simultaneously an electrical signal to correction means 89, 89' which will effect correction for spherical aberration in the image.

A condenser lens 80 is provided in the column which may comprise any standard magnetic condenser lens within which character aperture plate 76 is disposed. Lens 80 projects the source image 77 into the entrance pupil of a first demagnification lens 64. An aperture plate 66 is further provided along with a second demagnification lens 65 which operate in the fashion described in the afore-mentioned Pfeiffer application. Thus, the composite character image is demagnified in two steps through the demagnification lenses, and while the composite image is being demagnified, lens 64 simultaneously creates a magnified image of the source on the plane of circular aperture 81. This image of the source is dependent upon the position of source image 77. However, since source image 77 remains stationary irrespective of deflection in forming the composite aperture image, the focused image 82 of the source remains centered about the column axis at aperture 81 if the afore-mentioned corrections for spherical aberration are applied. Consequently, substantially uniform current density is provided by circular aperture 81 which admits only the central or axial portion of the Gaussian source being traced and minimizes aberrations generated in the final lens.

A deflection yoke 68 is also provided for deflection of the composite character image across the target field. In addition, a projection lens 67 is provided surrounding the deflection yoke to facilitate focusing of image 83 at the target area illustrated by numeral 69.

The FIG. 5 embodiment comprises the same structural elements as are illustrated in FIG. 4 designated by like numerals. In the FIG. 5 embodiment the image of the first square aperture 72 is deflected by deflection plates 78, 78' of the character selection means to intercept a character aperture selected along the periphery of the character aperture plate 75. Consequently, it is necessary to apply correction voltages to dynamic correction means 89, 89' in the manner described hereinafter in conjunction with FIG. 7.

Figure 6A:
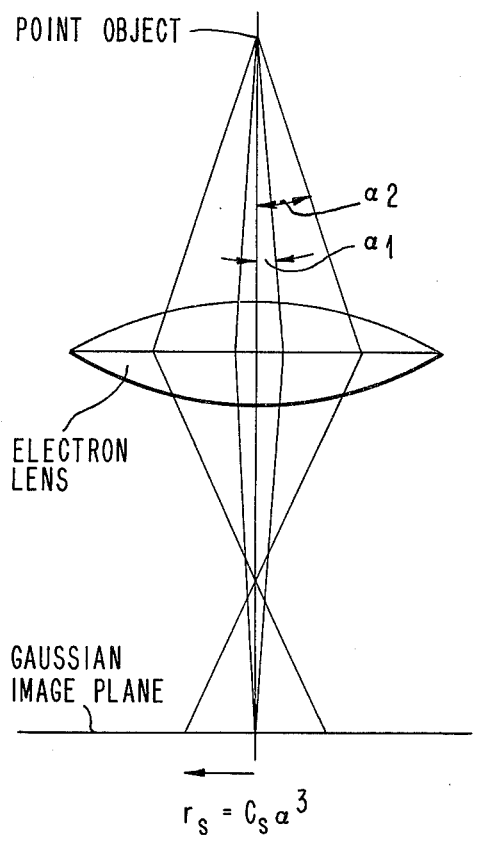
FIGS. 6A and 6B are diagrams useful in understanding spherical aberration.
Figure 6B:
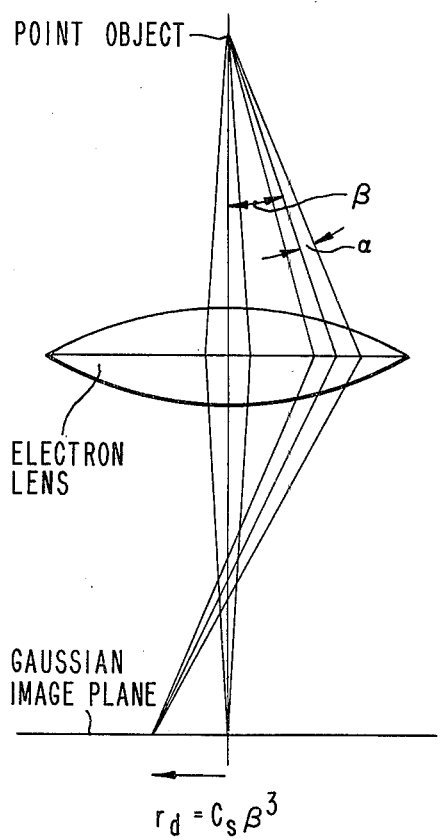

Referring now to FIGS. 6A and 6B, an electron lens converges marginal rays $\alpha_2$ more strongly than rays $\alpha_1$ which are closer to the axis. The image in the Gaussian plane which corresponds to an axial point object is spread over a spot of radius $r_s$ which is proportional to the cube of the beam semiangle $\alpha$, as represented by equation 1 below:

$$r_s = c_s \alpha^3 \qquad (1)$$

$r_s$, which represents the radius of the image blurring disk caused by spherical aberration, increases rapidly with beam semiangle $\alpha$. This image blurring is uncorrectable. $c_s$, on the other hand, is the spherical aberration constant and depends upon the geometry and focal powers of the lens. FIG. 6B illustrates the case where a narrow beam bundle with a small and constant $\alpha$ is deflected into marginal regions of the lens. Here the result of spherical aberration is image distortion rather than image blurring, neglecting coma and other third order aberrations of the lens because $\alpha$ is very much smaller than $\beta$. The relationship is defined in equation 2 below:

$$r_d = c_s \beta^3 \qquad (2)$$

This distortion or image movement of the beam can be corrected by suitable beam deflection in the opposite direction. Thus, in FIG. 7 a block diagram is illustrated of a character selector and circuitry for beam deflection to correct such distortion. Amplifiers 84 and 85 apply a push-pull signal to the main deflection plates 88, 88' and provide an input to the nonlinear amplifiers 90, 90'. Nonlinear amplifier 90 generates a correction signal of the form $cx + c_1x^3 + c_2x^2y$ and the nonlinear amplifier 90' generates the inverse signal $-cx - c_1x^3 - c_2x^2y$.

This push-pull signal is applied to the auxiliary deflection plates 89 and 89', respectively. The linear components $cx$ and $-cx$ of the push-pull signal are identical to the correction signal applied in the aforementioned Pfeiffer application. This provides means of moving the virtual deflection center into coincidence with the image plane of the source. The nonlinear components $c_1x^3 + c_2x^2y$ and the inverse signal $-c_1x^3 - c_2x^2y$ are useful in correcting the image movement $r_d$ caused by the variations in convergence of the lens which are responsible for spherical aberration of electron lenses, as illustrated in FIG. 6B.

In order to cover a large variety of character shapes as utilized in the aperture plate 76 illustrated in FIG. 4 the beam must be deflected into marginal regions far off center of the lens. This mode of operation is distinctly different from the deflection described in the aforementioned Pfeiffer application and consequently requires correction of the additional aberrations, as described, by use of nonlinear compensation signals.

The projection lens described hereinbefore has been found to be particularly useful in fabrication of large scale integrated circuit patterns of repetitive nature such as those encountered in fabrication of magnetic bubble memories. It should be apparent, however, that the projection system could be utilized in other applications, if desired.

What is claimed is:

1. An electron beam column adapted for writing entire characters or portions thereof on a wafer comprising
   a source directing a beam of electrons along a column axis toward a target area where said wafer is located,
   first aperture means having a rectangular aperture formed therein for intercepting portions of the beam to form a beam cross section corresponding to the aperture,
   character aperture means spaced along said axis downstream of the first aperture means having a plurality of apertures formed therein of the shape of entire characters or portions of characters, at least some of the apertures being oriented at off axis locations with respect to the said column axis,
   means for focusing the image of the first aperture means in the plane of the second aperture means, and for focusing the image of the source between said apertures,
   deflection means located between the first aperture means and the character aperture means for selectively deflecting the rectangular image of the first aperture to intercept one or more apertures or portions thereof of the character aperture means to form a composite image of the first aperture image and the intercepted portions of the apertures of the character aperture means,
   means for focusing the composite image in a target area, and
   compensating means located between the lens means and the second aperture means for correcting imperfections in the target image due to spherical aberration caused by deflection of the beam through off axis apertures of the character aperture means.

2. The column of claim 1 further including deflection means for deflecting one or more composite images to compose complex multicomponent shapes in said target area, and
   other deflection means for positioning such complex shapes at preselected locations within the entire field of deflection.

3. The column of claim 1 wherein said deflection means includes deflection plates positioned between the first aperture means and the second aperture means, and correction circuit means for applying signals to said deflection means to overcome beam movement due to spherical aberration that occurs with selection of a character aperture at off axis locations and thereby maintain proper illumination of the image focused in the target area.

4. The column of claim 3 wherein said correction circuit means includes nonlinear amplifier means for producing correction signals of predetermined nonlinear form.

5. The column of claim 3 wherein said correction circuit means includes a correction circuit with nonlinear amplifier means for applying nonlinear correction signals to correct for target image imperfections including beam intensity changes and variations in resolution of the focusing means.

* * * * *